(12) United States Patent
Baer

(10) Patent No.: US 7,369,072 B2
(45) Date of Patent: May 6, 2008

(54) METHOD AND APPARATUS FOR CALIBRATING IMAGING DEVICE CIRCUITS

(75) Inventor: Richard L. Baer, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/513,393

(22) Filed: Aug. 31, 2006

(65) Prior Publication Data

US 2008/0055128 A1    Mar. 6, 2008

(51) Int. Cl.
*H03M 1/00*     (2006.01)
(52) U.S. Cl. ..................... 341/125; 341/120
(58) Field of Classification Search ......... 341/120–155
See application file for complete search history.

(56) References Cited

U.S. PATENT DOCUMENTS

| | | | |
|---|---|---|---|
| 6,020,838 A * | 2/2000 | Knudsen et al. ............ | 341/143 |
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,621,431 B2 * | 9/2003 | Engl et al. ................. | 341/120 |
| 6,987,472 B2 * | 1/2006 | Lin ............................ | 341/120 |
| 6,993,441 B1 * | 1/2006 | Tsyrganovich ............... | 702/69 |
| 7,085,663 B1 * | 8/2006 | Tsyrganovich ............... | 702/69 |
| 2005/0243193 A1 | 11/2005 | Gove et al. | |

* cited by examiner

*Primary Examiner*—Lam T. Mai
(74) *Attorney, Agent, or Firm*—Dickstein Shapiro LLP

(57) ABSTRACT

A method of operating an imaging device, an imaging device, a camera system including an imaging device, and a processing system including an imaging device for calibrating an analog-to-digital converter of the imaging device to generate a look-up table of correction values, and correcting an output of the analog-to-digital converter with the correction values.

37 Claims, 11 Drawing Sheets

METHOD AND APPARATUS FOR CALIBRATING IMAGING DEVICE CIRCUITS

FIELD OF THE INVENTION

Embodiments of the invention relate to methods and apparatuses for calibrating circuits in an imaging device.

BACKGROUND OF THE INVENTION

A CMOS imaging device circuit includes a focal plane array of pixels, each one including a photosensor, for example, a photogate, photoconductor or a photodiode overlying a substrate for accumulating photo-generated charge in the underlying portion of the substrate. Each pixel has a readout circuit that includes at least an output field effect transistor formed in the substrate and a charge storage region formed on the substrate connected to the gate of an output transistor. The charge storage region may be constructed as a floating diffusion region. Each pixel may include at least one electronic device such as a transistor for transferring charge from the photosensor to the storage region and one device, also typically a transistor, for resetting the storage region to a predetermined charge level prior to charge transference.

In a CMOS imaging device, the active elements of a pixel perform the necessary functions of: (1) photon to charge conversion; (2) accumulation of image charge; (3) resetting the storage region to a known state; (4) transfer of charge to the storage region accompanied by charge amplification; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imaging devices of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

FIG. 1 illustrates a portion of a conventional CMOS imaging device 10. The illustrated imaging device 10 includes a pixel 20, one of many that are in a pixel array (not shown), connected to a column sample and hold circuit 40 by a pixel output line 32, also referred to as a column line. The imaging device 10 also includes a readout programmable gain differential amplifier (PGA) 70 and an analog-to-digital converter (ADC) 80.

The illustrated pixel 20 includes a photosensor 22 (e.g., a pinned photodiode, photogate, etc.), transfer transistor 24, floating diffusion region FD, reset transistor 26, source follower transistor 28 and row select transistor 30. FIG. 1 also illustrates parasitic capacitance Cp1 associated with the floating diffusion region FD and the pixel's 20 substrate. The photosensor 22 is connected to the floating diffusion region FD by the transfer transistor 24 when the transfer transistor 24 is activated by a transfer control signal TX. The reset transistor 26 is connected between the floating diffusion region FD and an array pixel supply voltage Vaa-pix. A reset control signal RST is used to activate the reset transistor 26, which resets the floating diffusion region FD (as is known in the art).

The source follower transistor 28 has its gate connected to the floating diffusion region FD and is connected between the array pixel supply voltage Vaa-pix and the row select transistor 30. The source follower transistor 28 converts the stored charge at the floating diffusion region FD into an electrical output voltage signal. The row select transistor 30 is controllable by a row select signal SELECT for selectively connecting the source follower transistor 28 and its output voltage signal to the pixel output line 32.

The column sample and hold circuit 40 includes a bias transistor 56, controlled by a control voltage Vln_bias, that is used to bias the pixel output line 32. The pixel output line 32 is also connected to a first capacitor 44 thru a sample and hold reset signal switch 42. The sample and hold reset signal switch 42 is controlled by the sample and hold reset control signal SAMPLE_RESET. The pixel output line 32 is also connected to a second capacitor 54 thru a sample and hold pixel signal switch 52. The sample and hold pixel signal switch 52 is controlled by the sample and hold pixel control signal SAMPLE_SIGNAL. The switches 42, 52 are typically MOSFET transistors.

A second terminal of the first capacitor 44 is connected to the amplifier 70 via a first column select switch 50, which is controlled by a column select signal COLUMN_SELECT. The second terminal of the first capacitor 44 is also connected to a clamping voltage VCL via a first clamping switch 46. Similarly, the second terminal of the second capacitor 54 is connected to the amplifier 70 by a second column select switch 60, which is controlled by the column select signal COLUMN_SELECT. The second terminal of the second capacitor 54 is also connected to the clamping voltage VCL by a second clamping switch 48.

The clamping switches 46, 48 are controlled by a clamping control signal CLAMP. As is known in the art, the clamping voltage VCL is used to place a charge on the two capacitors 44, 54 when it is desired to store the reset and pixel signals, respectively (when the appropriate sample and hold control signals SAMPLE_RESET, SAMPLE_SIGNAL are also generated).

Referring to FIGS. 1 and 2, in operation, the row select signal SELECT is driven high, which activates the row select transistor 30. When activated, the row select transistor 30 connects the source follower transistor 28 to the pixel output line 32. The clamping control signal CLAMP is then driven high to activate the clamping switches 46, 48, allowing the clamping voltage VCL to be applied to the second terminal of the sample and hold capacitors 44, 54. The reset signal RST is then pulsed to activate the reset transistor 26, which resets the floating diffusion region FD. The signal on the floating diffusion region FD is then sampled when the sample and hold reset control signal SAMPLE_RESET is pulsed. At this point, the first capacitor 44 stores the pixel reset signal $V_{rst}$.

Immediately afterwards, the transfer transistor control signal TX is pulsed, causing charge from the photosensor 22 to be transferred to the floating diffusion region FD. The signal on the floating diffusion region FD is sampled when the sample and hold pixel control signal SAMPLE_SIGNAL is pulsed. At this point, the second capacitor 54 stores a pixel image signal $V_{sig}$. A differential signal $(V_{rst}-V_{sig})$ is produced by the differential amplifier 70. The differential signal is digitized by the analog-to-digital converter 80. The analog-to-digital converter 80 supplies the digitized pixel signals to an image processor 90, which forms a digital image output.

Conventional imaging devices such as the imaging device 10 shown in FIG. 1 include an analog-to-digital converter 80. When an analog-to-digital converter operates at high speeds, its output becomes nonlinear as the speed increases.

The cost of high bit depth (e.g., 12-14 bits) increases when the analog-to-digital converter has intrinsically poor linearity. Bit depth is the resolution of the analog-to-digital converter. For instance, if the bit depth is 12 bits, there would be 4,096 possible values for the output of the analog-to-digital converter. Manufacturing analog-to-digital converters with high bit depth and high linearity is time-consuming and expensive.

A method and apparatus for improving the linearity of imaging device analog-to-digital converters is desirable.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice them, and it is to be understood that other embodiments may be utilized, and that structural, logical, processing, and electrical changes may be made. The progression of processing steps described is an example; however, the sequence of steps is not limited to that set forth herein and may be changed as is known in the art, with the exception of steps necessarily occurring in a certain order.

The term "pixel," as used herein, refers to a photo-element unit cell containing a photosensor and associated transistors for converting photons to an electrical signal. For purposes of illustration, a single representative pixel and its manner of formation is illustrated in the figures and description herein; however, typically fabrication of a plurality of like pixels of a pixel array proceeds simultaneously.

Embodiments relate to a method of operating an imaging device, an imaging device, a camera system including an imaging device, and a processing system including an imaging device for calibrating an analog-to-digital converter to generate a look-up table of correction values, and correcting an output of the analog-to-digital converter with the correction values.

Figure 1:
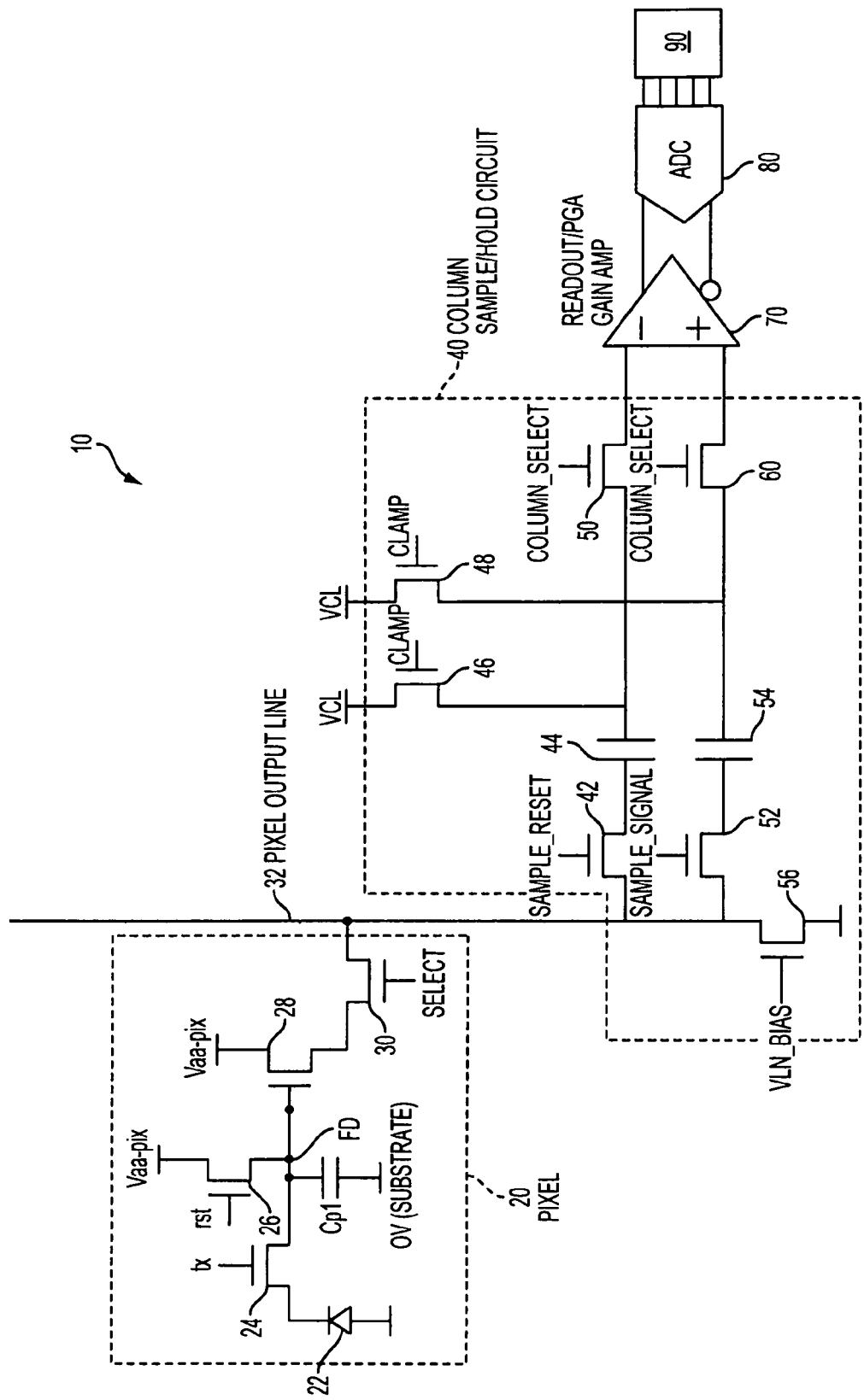
FIG. 1 illustrates a diagram of a portion of a typical CMOS imaging device.
Figure 2:
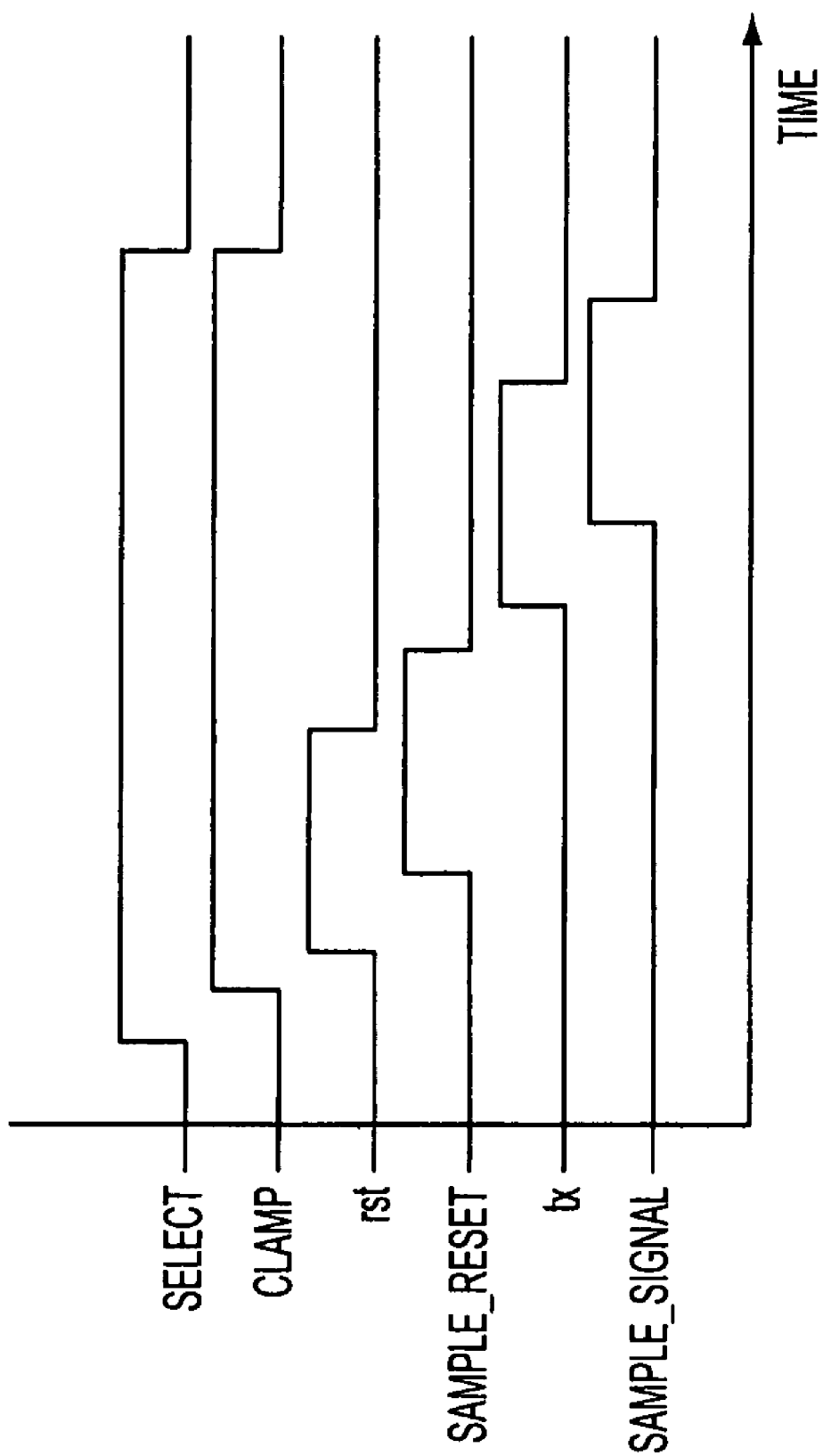
FIG. 2 illustrates a timing diagram of the operation of the FIG. 1 imaging device.
Figure 3:
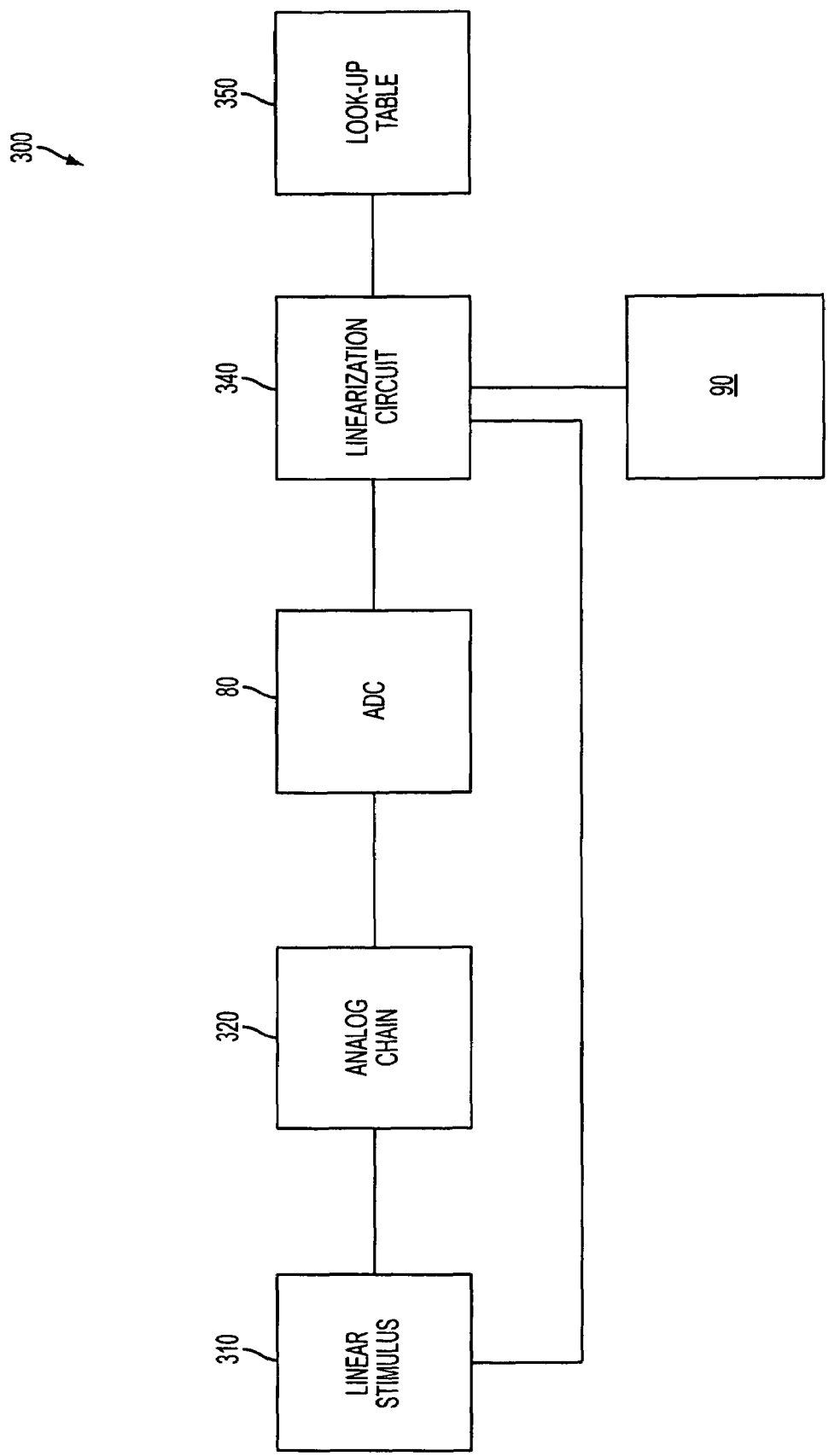
FIG. 3 illustrates a block diagram of a portion of an imaging device constructed in accordance with an embodiment of the invention.

Now referring to the figures, where like numerals designate like elements, FIG. 3 illustrates a block diagram of a portion of an imaging device 300 constructed in accordance with an embodiment. Imaging device 300 is provided with a linear stimulus 310, which is connected to an analog chain 320. The analog chain 320 includes at least one pixel 20 (FIG. 1) and associated readout circuitry, such as the column sample and hold circuit 40 (FIG. 1) and readout programmable gain differential amplifier (PGA) 70 (FIG. 1). The analog chain 320 is connected to an analog-to-digital converter (ADC) 80. ADC 80 is coupled to a linearization circuit 340, which is connected to a memory storing a look-up table 350 and to the linear stimulus 310.

During a calibration operation, the linear stimulus 310 provides a known calibration signal to the analog chain 320 and directly to the linearization circuit 340. The output of the analog chain 320 is processed by the ADC 80. The output of the ADC 80 is passed to the linearization circuit 340, where the output is compared to the known calibration signal generated by the linear stimulus 310 to generate a look-up table 350 of possible analog-to-digital converter outputs and corresponding correction values for correcting the linearity of ADC 80 (described below).

Figure 4A:
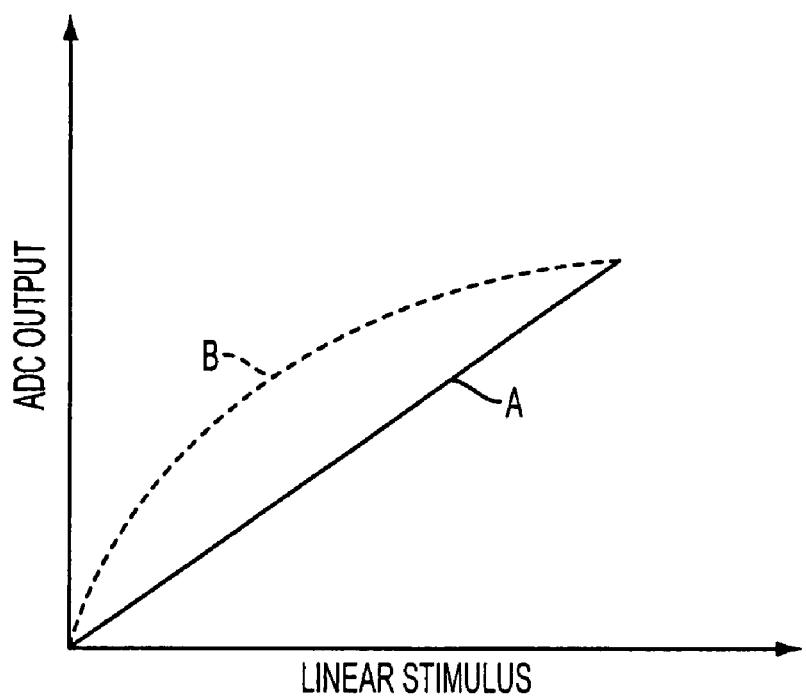
FIG. 4A is a graph illustrating a linear input and an output of an imaging device constructed in accordance with an embodiment of the invention.

FIG. 4A is a graph illustrating a linear input stimulus versus analog-to-digital converter outputs of the imaging device 300 constructed in accordance with an embodiment. An ideal linear output of ADC 80 (FIGS. 1 and 3) is shown by line A, where the output A is directly proportional to the input of the linear stimulus 310. Line B shows an example of a nonlinear output of ADC 80, which is corrected to make the output match line A using the linearization circuit 340 and look-up table 350 as described above with reference to FIG. 3.

During a correction operation, active imaging device pixels (e.g., pixel 20) receive image data, which is processed through the associated readout circuitry, such as the column sample and hold circuit 40 (FIG. 1), readout PGA 70 (FIG. 1), and ADC 80. The linearization circuit 340 compares the output of the ADC 80 to the possible analog-to-digital converter output values stored in the look-up table 350 and performs a correction operation on the output of the ADC 80 using the corresponding correction values to generate a linearized output. The linearized output is then supplied as digitized pixel signals to image processor 90 to form a linearized digital image output.

Figure 4B:
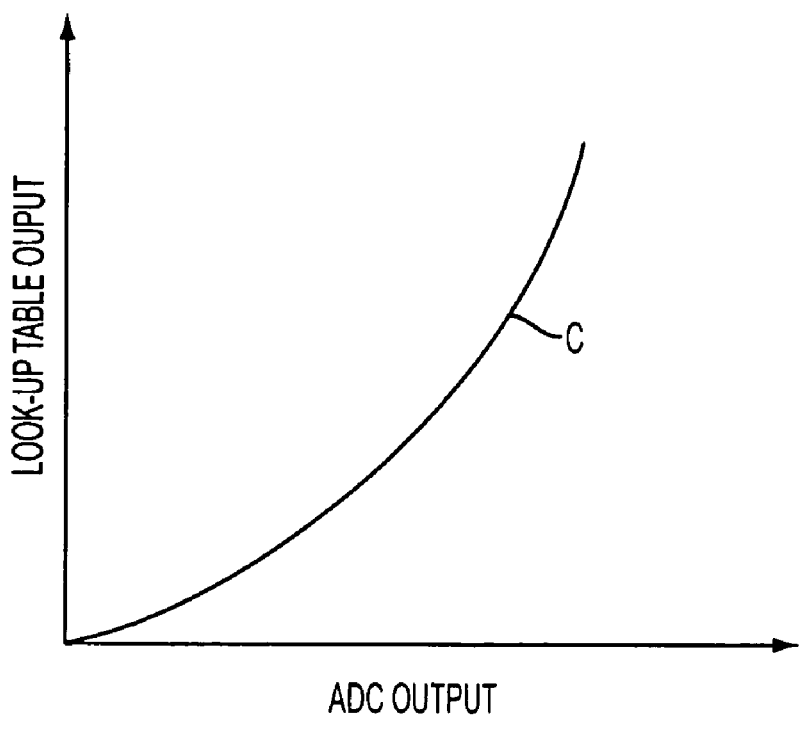
FIG. 4B is a graph illustrating look-up table values generated from the output of the imaging device during the calibration shown in FIG. 4A.

FIG. 4B is a graph illustrating look-up table correction values generated from the output of the imaging device 300 during calibration as shown in FIG. 4A. Line C charts the corresponding correction values stored in the look-up table 350 as a function of the output of the ADC 80. During the correction operation, the linearization circuit 340 applies the corresponding correction values of line C to the output from ADC 80 when image data is received by the imaging device 300, causing the output of the imaging device to be linearized to match line A (FIG. 4A).

In an embodiment, the ADC output may be multiplied by the corresponding correction value stored in the look-up table 350. In another embodiment, the ADC output may be replaced with corresponding correction values from the look-up table 350. Other embodiments may otherwise manipulate, and thereby linearize, the ADC 80 output according to corresponding values stored in the look-up table 350.

The look-up table 350 memory may include e.g., a random access memory (RAM) or a flash memory. Calibration may be performed each time the imaging device 300 is activated, or less often if desired. One entry in look-up table 350 may be used for each possible input value; for example, if the resolution of the ADC 80 is twelve bits, there could be 4,096 entries. Alternatively, a smaller number of entries may be used, for example, with an interpolation of points to cover the entire resolution range. A smaller number could be used if the pixels 20 are similar in linearity, which may be a function of manufacturing. Embodiments include one look-up table 350 for each ADC 80 used in the imaging device 300.

Figure 4C:
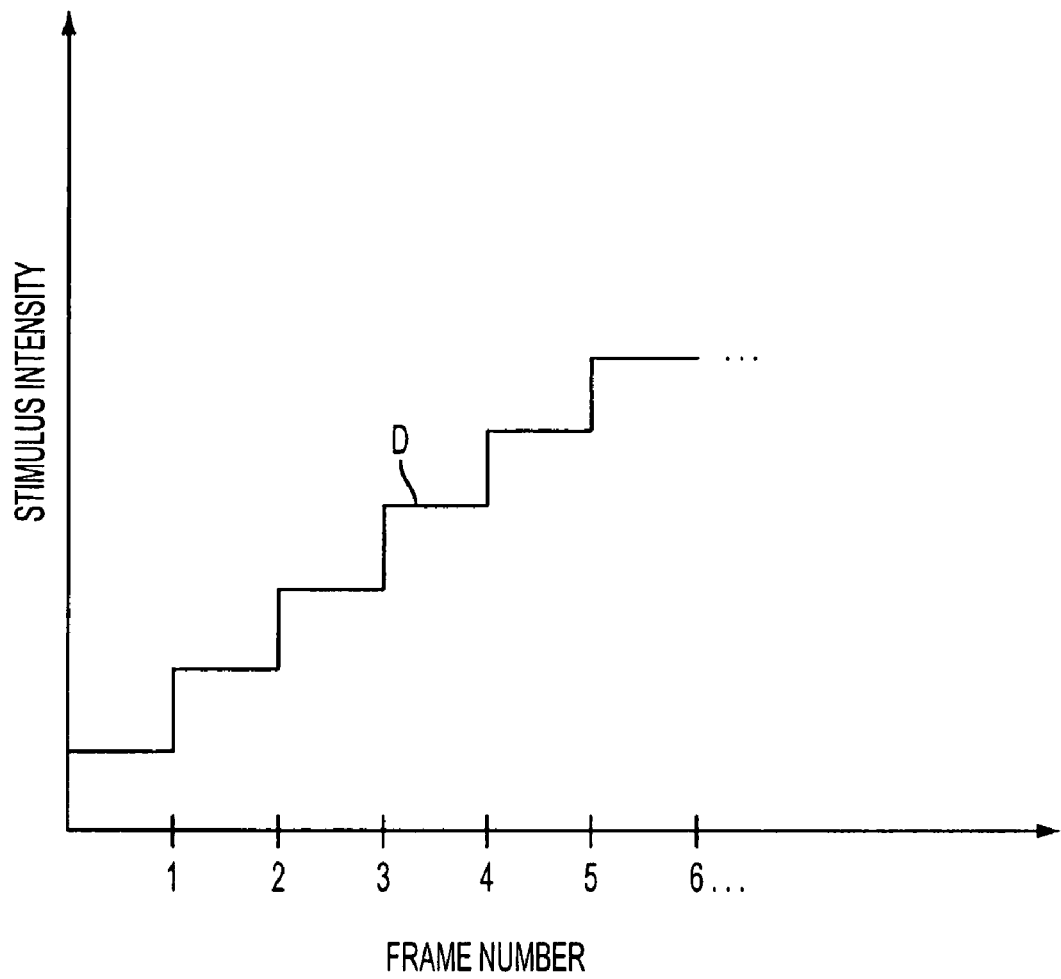
FIG. 4C is a graph illustrating incremental stimulus intensity for an embodiment of the invention.

FIG. 4C is a graph illustrating incremental stimulus intensity for an embodiment. During calibration, the intensity of the linear stimulus 310 (FIG. 3) is incrementally increased for a plurality of frames, and calibration is performed for each frame. A set of correction values is stored in look-up table 350 for each frame and intensity. Line D shows that for each successive frame, the intensity of the linear stimulus is increased by a fixed amount. At each frame, a correction value for the ADC 80 is calculated by linearization circuit 340 and stored in the look-up table 350. Therefore, one data point may be stored for each respective frame to correct the output of the ADC 80 at a given intensity. The plurality of data points may then be used to interpolate a curve such as that of line C of FIG. 4B. In the illustrated embodiment, line C is a transposition of line B.

The linear stimulus 310 may be electronic or optical. In an embodiment using an electronic linear stimulus, the stimulus 310 may include a digital-to-analog converter (DAC). In an embodiment using an optical linear stimulus, the stimulus 310 may include a light source, such as a light-emitting diode (LED) producing a light signal to one or more pixel cells 20 of an array.

Embodiments include using an electronic stimulus as a linear stimulus.

Figure 5A:
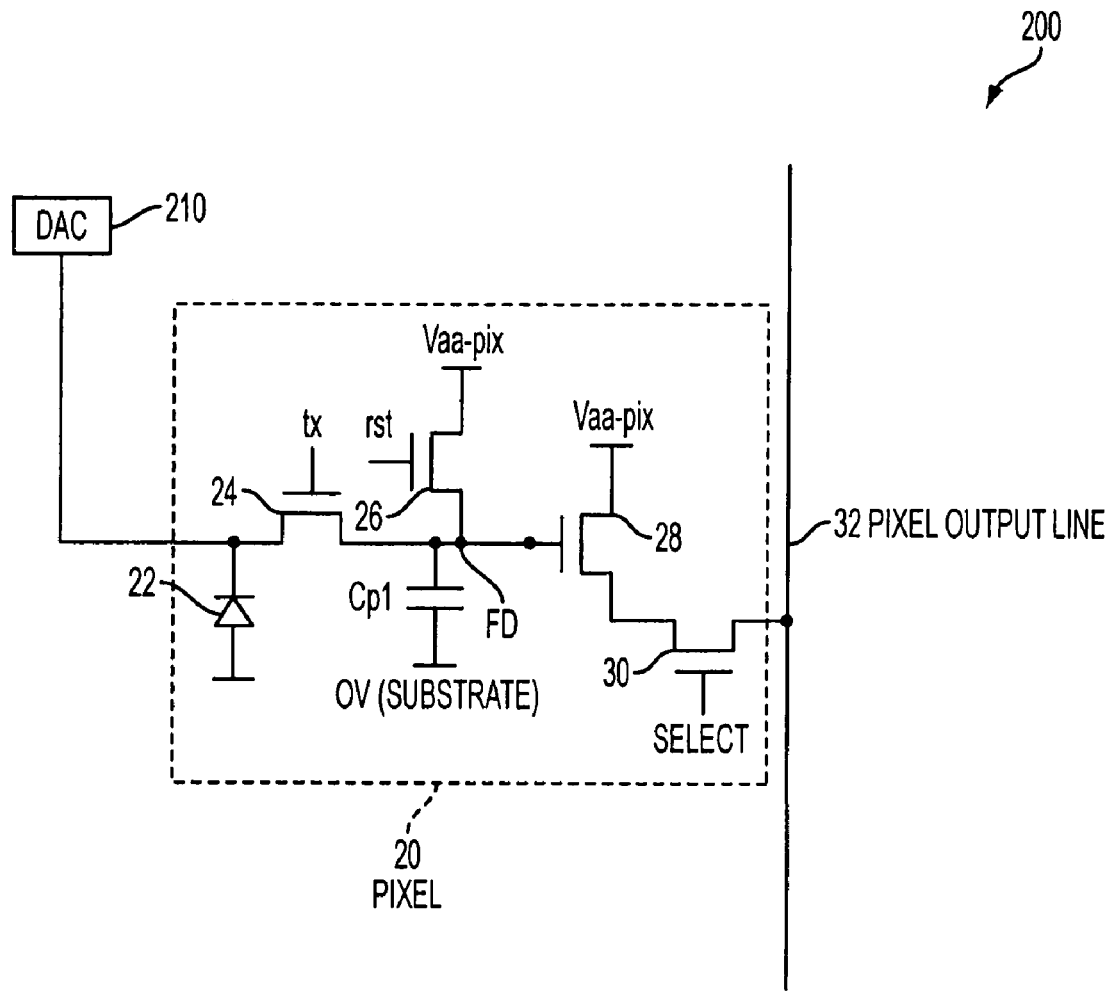
FIG. 5A illustrates in schematic form a portion of an imaging device constructed in accordance with an embodiment of the invention.
Figure 5B:
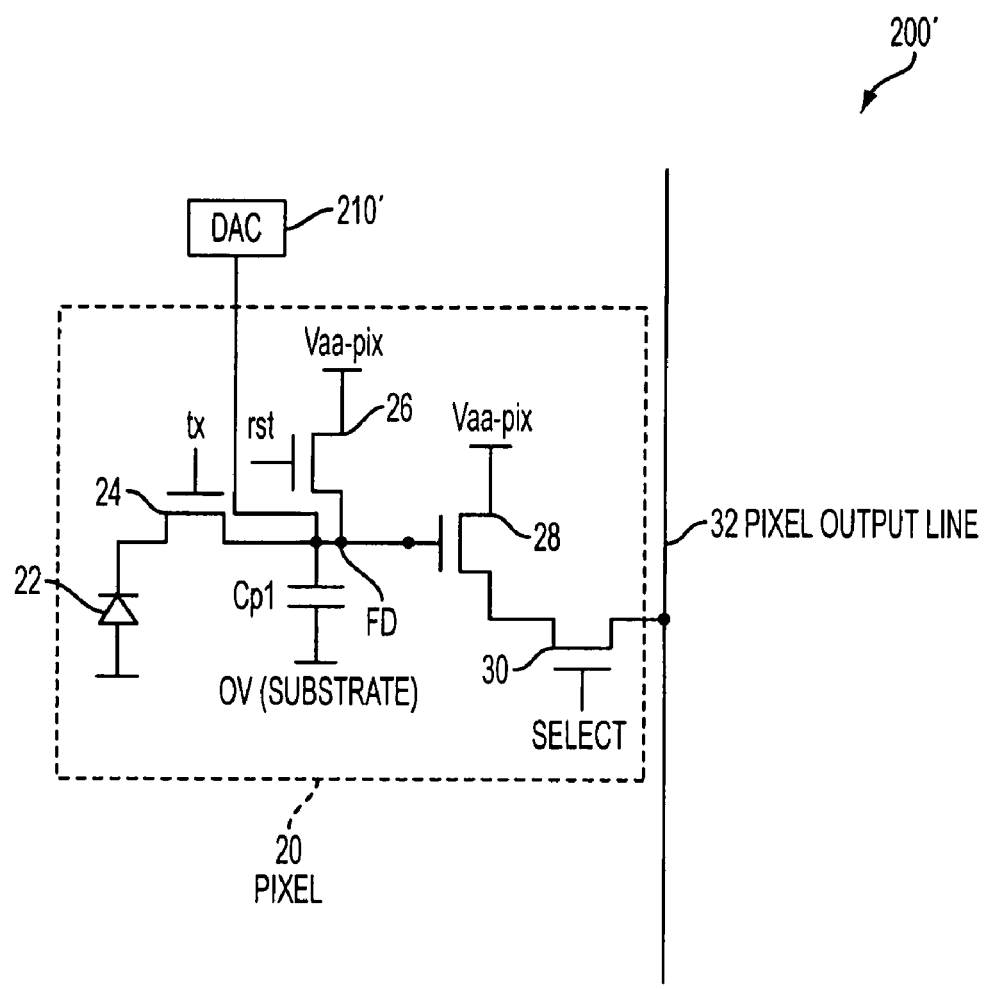
FIG. 5B illustrates in schematic form a portion of an imaging device constructed in accordance with an embodiment of the invention.

FIG. 5A illustrates in schematic form a portion of an imaging device 200 constructed in accordance with an embodiment using an electronic stimulus. Imaging device 200 includes a pixel 20 (described above with reference to FIG. 1) with a DAC 210 connected to the pixel's photosensor 22. The DAC 210 provides a known charge signal to photosensor 22 which is read out and digitized by the ADC 80. FIG. 5B illustrates in schematic form a portion of an imaging device 200' constructed in accordance with another embodiment using an electronic stimulus. Imaging device 200' includes pixel 20, but has a DAC 210' connected to the floating diffusion region FD instead of the photosensor 22 to provide a known charge signal to the floating diffusion region FD which is read out and digitized by the ADC 80. Accordingly, DACs 210 and 210' correspond to linear stimulus 310 (FIG. 3).

Since DAC 210 (or DAC 210') corresponds to linear stimulus 310, in operation, DAC 210 (or DAC 210') provides a known analog calibration signal to the analog chain 320 (via pixel 20) where indicated, respectively, in FIGS. 5A and 5B, as well as directly to the linearization circuit 340. The processed calibration signal is output by the analog chain 320, and further processed by the ADC 80. The output of the ADC 80 is passed to the linearization circuit 340, where the ADC 80 output is compared to the known calibration signal generated by the DAC 210 (or DAC 210') to generate the look-up table 350 of possible analog-to-digital converter output and corresponding correction values for correcting the linearity of ADC 80.

If DAC 210 (or DAC 210') outputs a voltage, its connection perturbs the system; for example, a connection to the floating diffusion region FD would increase its capacitance, thereby masking the voltage/charge (V/Q) curve, which would be measured. Therefore, only components downstream from the DAC 210 (or DAC 210') connection can be measured and calibrated by the electronic stimulus. If the connection is made as illustrated in FIG. 5B, only the source follower transistor 28, reset transistor 26, row select transistor 30, and circuitry beyond the pixel output line 32 can be measured for linearity (e.g., column sample and hold circuit 40 (FIG. 1), readout PGA 70 (FIG. 1), and ADC 80 (FIGS. 1 and 3)). If, however, the DAC 210 (or DAC 210') outputs a current, rather than a voltage, the connection does not perturb the system, and the linearity at the connection point may also be measured.

In general, the digital-to-analog converters 210, 210' may function at lower speeds than the analog-to-digital converter 80; therefore, at such lower speeds the digital-to-analog converters 210, 210' are not subject to nonlinearity caused by high-speed operation. In addition, a digital-to-analog converter or other electronic stimulus may be implemented on the same chip as the imaging device 300.

Figure 6:
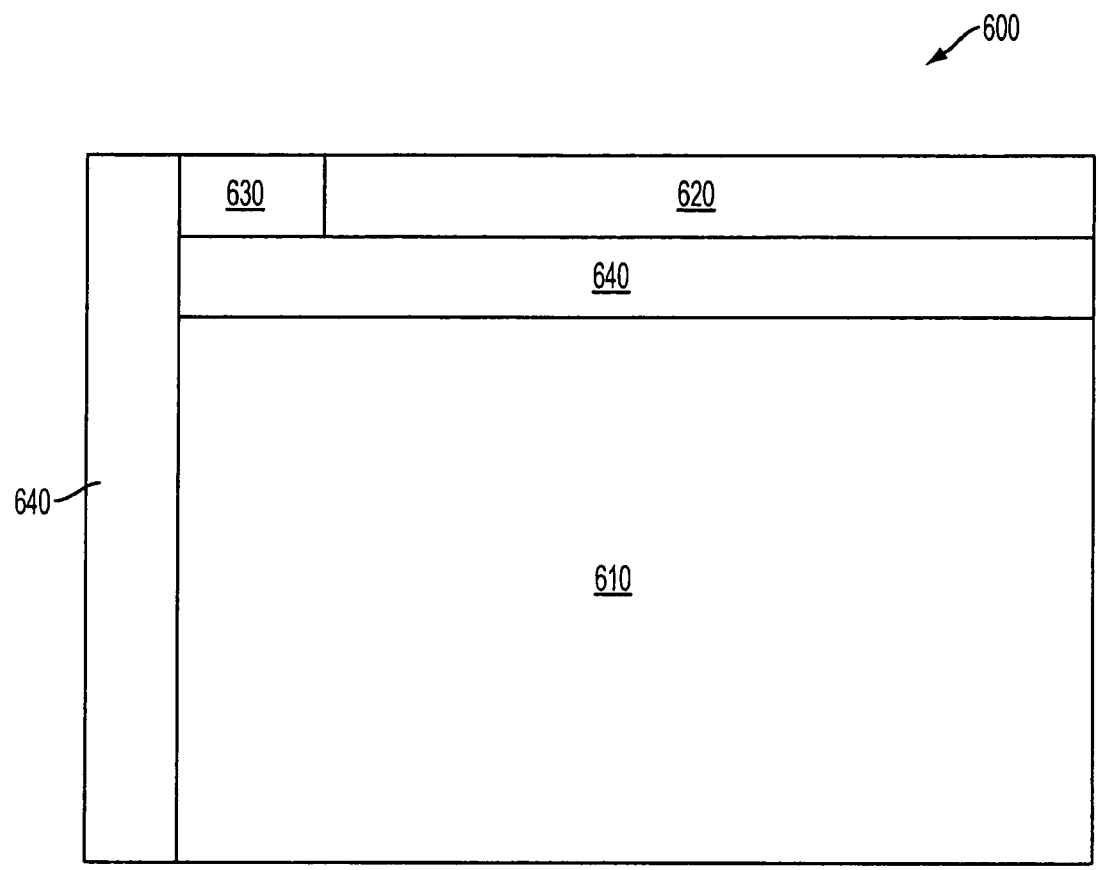
FIG. 6 illustrates a block diagram of a pixel array of an imaging device constructed in accordance with an embodiment of the invention using an electronic stimulus.

FIG. 6 illustrates a block diagram of a pixel array 600 of an imaging device constructed in accordance with an embodiment using an electronic stimulus. The array 600 includes image pixels 610 (e.g., pixel 20) having associated readout circuitry as illustrated in FIG. 1. The pixel array 600 further includes at least one row 620 of optically black (OB) pixels with at least part of the row 620 configured as a linearizing section 630. The linearizing section 630 is configured as shown in FIG. 5A or 5B for calibration and correction of the ADC 80 (FIGS. 1 and 3). OB pixels may be formed, for instance, by shielding part of array 600 from light. Optically black signals from the OB pixels are typically used to generate reference signals to cancel out noise from reset and pixel signals of imaging pixels 610. Linearizing section 630 may also be an entire row in the section of OB pixels, a plurality of rows, or a section of multiple rows. Pixel array 600 may optionally include barrier sections 640 for isolating the imaging pixels 610 from the OB pixels and other circuitry within an imaging device.

Embodiments include using an optical stimulus as a linear stimulus.

Figure 7:
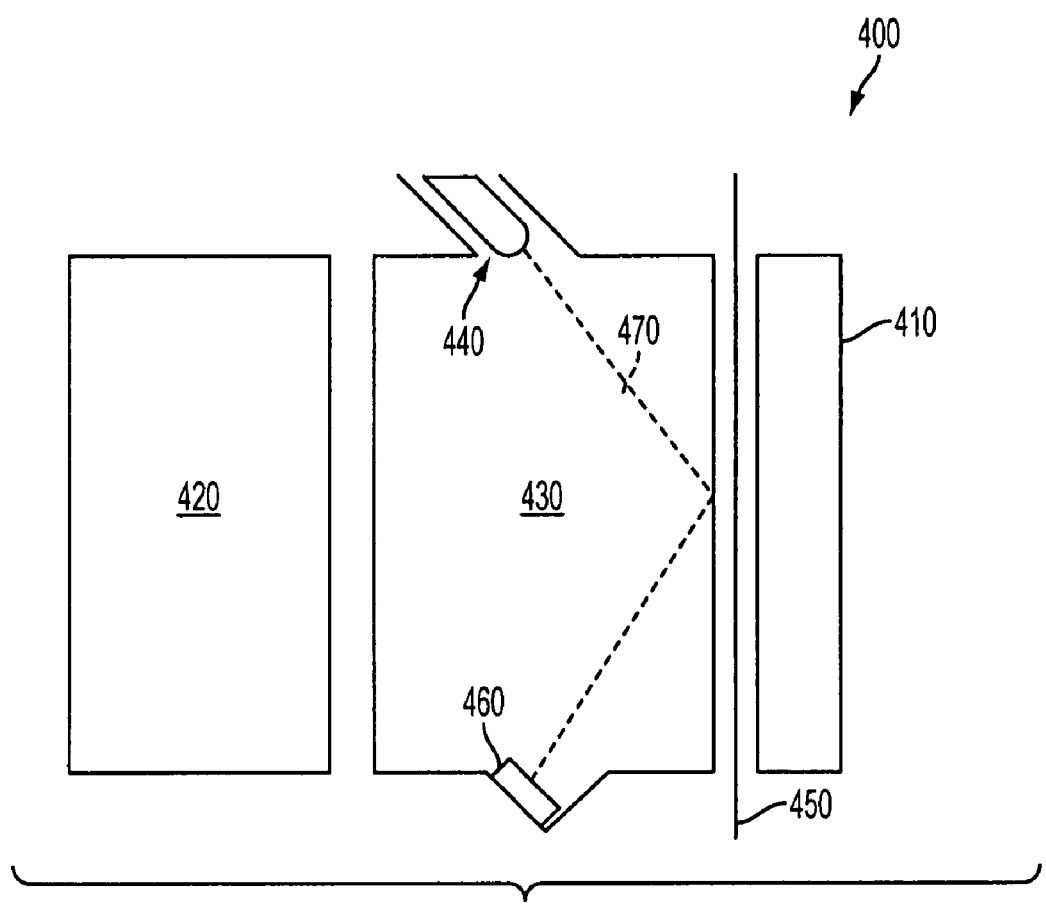
FIG. 7 illustrates a cross-sectional view of a camera system including an imaging device constructed in accordance with an embodiment of the invention using an optical stimulus.

To calibrate and correct components of the pixel 20 (FIG. 1) which are further upstream of the ADC, such as the floating diffusion region FD, it is preferable to use an optical linear stimulus. FIG. 7 illustrates a cross-sectional view of a camera system 400 including an imaging device 410 constructed in accordance with an embodiment using an optical stimulus. Camera system 400 includes the imaging device 410, lens assembly 420, baffle 430, light-emitting diode (LED) 440, shutter 450, and calibration photosensor 460. Calibration may be performed when the lens assembly 420 is blocked from receiving light, for example, by a lens cap (not shown). With the shutter 450 closed or blocked, LED 440 is activated, providing light along path 470 that bounces off of the closed shutter 450 and lands on calibration photosensor 460. Then, with the shutter 450 open and not blocked, LED 440 provides light directly to pixels on the imaging device 410.

The signal generated by the calibration photosensor 460 is used as the linear stimulus 310 (FIG. 3) provided directly to the linearization circuit 340 (FIG. 3). The light from LED 440 which is provided through the open shutter 450 is also used as the linear stimulus 310 provided to the analog chain 320 (FIG. 3), ADC 80 (FIGS. 1 and 3), and then to the linearization circuit 340. The calibration photosensor 460 signal is compared to the signal generated by ADC 80 to generate the look-up table 350 values and perform correction as described with reference to FIG. 3 above. The calibration photosensor 460 may be connected to a transconductance amplifier (not shown) to generate the signal.

In this embodiment, camera system 400 is a single-lens reflex (SLR) camera, however, the LED 440 may be used in such a configuration in any camera system having a reflective surface for bouncing light from the LED 440 to a calibration photosensor 460 along a light path 470 as shown. Furthermore, any light source capable of generating a consistent light may be used in place of the LED 440, and multiple light sources for consistent coverage, including a plurality of LEDs 440, may be used. Camera system 400 is also not intended to be limited to a photosensor 460, but may use any appropriate reference detector with a linear output.

Figure 8:
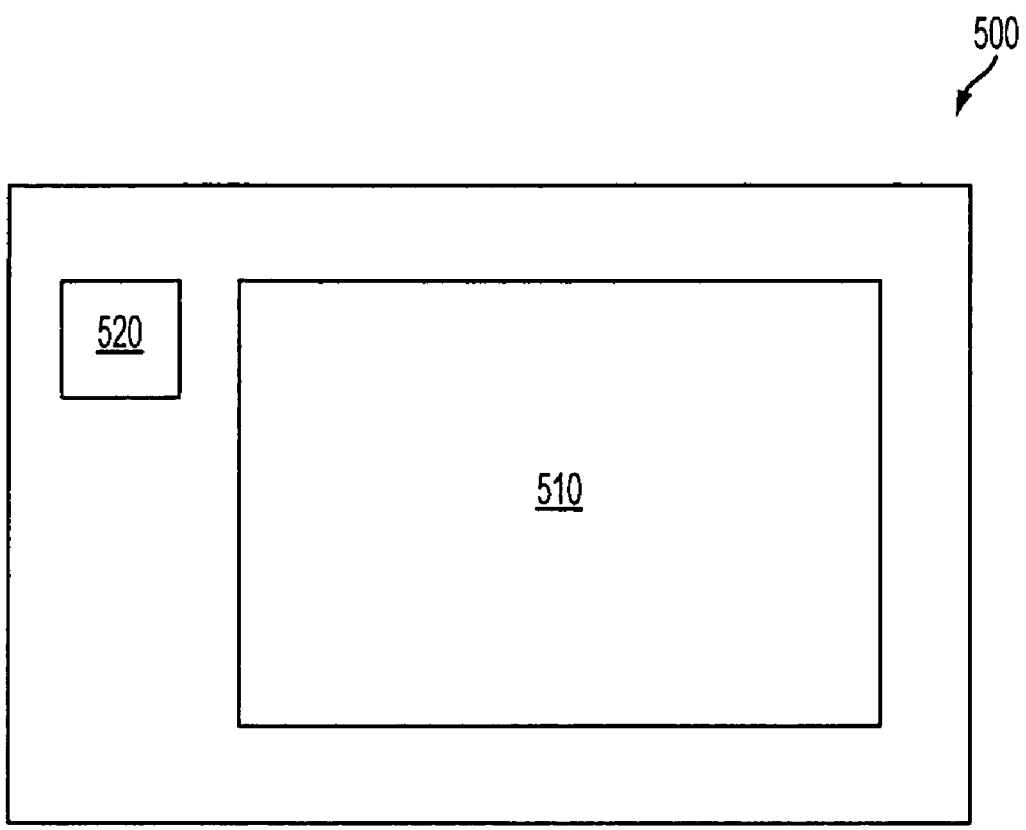
FIG. 8 illustrates a block representation of an imaging device constructed in accordance with an embodiment of the invention using an optical stimulus.

FIG. 8 illustrates a block representation of an imaging device 500 constructed in accordance with another embodiment using an optical stimulus. Imaging device 500 includes an array 510 of active pixels (e.g., pixel 20) and a reference detector 520. Reference detector 520 and the array 510 are simultaneously provided with light from a light source, e.g., from one or more LEDs (not shown). The signal generated by the reference detector 520 is used as the linear stimulus 310 (FIG. 3) provided directly to the linearization circuit 340 (FIG. 3). The light source is used as the linear stimulus 310 provided to the analog chain 320 (FIG. 3), ADC 80 (FIGS. 1 and 3), and then to the linearization circuit 340. The reference detector 520 signal is compared to the signal generated by ADC 80 to generate the look-up table 350 values and perform correction as described with reference to FIG. 3 above. If the pixels in array 510 (e.g., pixels 20) are similar in linearity, a portion of the array 510 may be used for calibration, allowing fewer points to be used in the calibration, and thus making the calibration faster.

The imaging devices described above are not limited to CMOS imaging devices, but may also include CCD, and any imaging technology which includes an analog-to-digital converter in its architecture. Furthermore, the electronic calibration may be performed by any circuit having a linear analog output with known corresponding digital values, and is not limited to a digital-to-analog converter. Nor is the light source of the optical calibration limited to an LED, but may be any light source capable of generating a consistent light. Where intensity of a stimulus is changed, embodiments may include changing the color of the light source, as well as the brightness of the light source. If there are multiple analog-to-digital converters in an array, the calibration and correction may be performed for each analog-to-digital converter separately.

Figure 9:
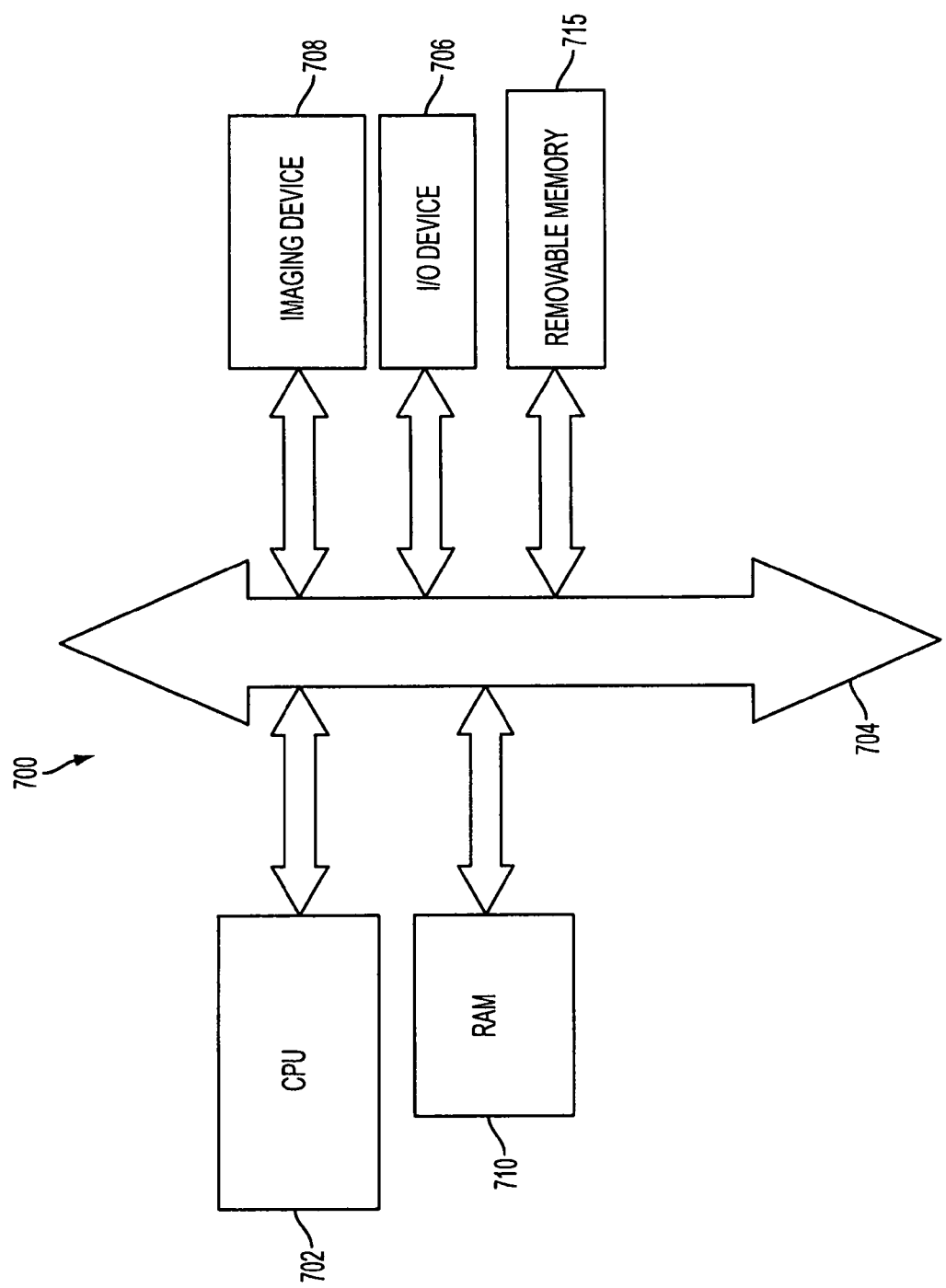
FIG. 9 illustrates a processor system incorporating at least one imaging device constructed in accordance with an embodiment of the invention.

FIG. 9 shows system 700, a typical processor system modified to include an imaging device 708 constructed in accordance with an embodiment (i.e., imaging device 300 of FIG. 3). The system 700 is an example of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 700, for example a still or video camera system, generally comprises a central processing unit (CPU) 702, such as a microprocessor, that communicates with one or more input/output (I/O) devices 706 over a bus 704. Imaging device 708 also communicates with the CPU 702 over the bus 704. The processor-based system 700 also includes random access memory (RAM) 710, and can include removable memory 715, such as flash memory, which also communicate with the CPU 702 over the bus 704. The imaging device 708 may be combined with a processor, such as a CPU, digital signal processor, or microprocessor, with or without memory storage on a single integrated circuit or on a different chip than the processor.

The processes and devices in the above description and drawings illustrate examples of methods and devices of many that could be used and produced to achieve the objects, features, and advantages of embodiments described herein. Thus, they are not to be seen as limited by the foregoing description of the embodiments, but only limited by the appended claims.

What is claimed is:

1. A method of operating an imaging device comprising:
providing a linear stimulus to an imaging device to produce a calibration signal, the imaging device comprising an analog-to-digital converter which converts a representation of the calibration signal to a digital value;
sampling an output of the analog-to-digital converter;
determining correction values with a linearization circuit for a linear output based on the value of the linear stimulus and the sampled output of the analog-to-digital converter; and
storing the correction values in a storage circuit.

2. The method of claim 1, further comprising:
receiving image data in the imaging device;
processing the image data through the analog-to-digital converter to produce digital values;
determining output values for the image data based on the digital values and the stored correction values; and
using the determined output values as the image data values.

3. The method of claim 2, wherein determining output values comprises multiplying the processed image data with the stored correction values.

4. The method of claim 2, wherein determining output values comprises substituting the processed image data with the stored correction values.

5. The method of claim 1, wherein providing a linear stimulus comprises providing an electronic stimulus to the imaging device and to the linearization circuit.

6. The method of claim 5, wherein providing an electronic stimulus comprises providing an output of a digital-to-analog converter to the imaging device and to the linearization circuit.

7. The method of claim 1, wherein providing a linear stimulus comprises providing an optical stimulus to the imaging device and to the linearization circuit.

8. The method of claim 7, wherein providing an optical stimulus comprises:
providing a reference detector for generating the calibration signal;
providing light to the reference detector and the imaging device; and
sampling an output of the reference detector to generate the calibration signal.

9. The method of claim 8, wherein providing a reference detector comprises providing a light-receiving device having linear output characteristics.

10. The method of claim 8, wherein providing a reference detector comprises providing a photo-conversion device.

11. The method of claim 10, further comprising providing an amplifier coupled to the output of the photo-conversion device for generating the calibration signal.

12. The method of claim 1, wherein the storage circuit comprises a look-up table.

13. An imaging device comprising:
a linear stimulus device for providing a calibration signal;
an analog chain adapted to receive the calibration signal from the linear stimulus device, the analog chain comprising a pixel and associated pixel readout circuitry;
an analog-to-digital converter coupled to the analog chain, the analog-to-digital converter converting a representation of the calibration signal to a digital value;
a linearization circuit adapted to receive an output from the analog-to-digital converter and the calibration signal from the linear stimulus device, the linearization circuit further adapted to determine correction values for linearizing the analog-to-digital converter output based on the analog-to-digital converter output and the calibration signal; and
a storage circuit adapted to receive and store the correction values from the linearization circuit.

14. The imaging device of claim 13, wherein the correction values comprise multiplicative factors of the analog-to-digital converter output.

15. The imaging device of claim 13, wherein the correction values comprise substitution values for the analog-to-digital converter output.

16. The imaging device of claim 13, wherein:
the analog chain is further adapted to receive image data;
the analog-to-digital converter is further adapted to process the image data to produce digital values;
the linearization circuit is further adapted to:
determine corrected values for the image data based on the digital values and the stored correction values; and
use the determined output values as the image data values.

17. The imaging device of claim 16, wherein the linearization circuit determines the corrected values by multiplying the processed image data with the stored correction values.

18. The imaging device of claim 16, wherein the linearization circuit determines the corrected values by substituting the processed image data with the stored correction values.

19. The imaging device of claim 13, wherein the linear stimulus device comprises an electronic stimulus device.

20. The imaging device of claim 19, wherein the electronic stimulus device comprises a digital-to-analog converter coupled to the analog chain and to the linearization circuit.

21. The imaging device of claim 20, wherein the pixel comprises:
a photo-conversion device;
a floating diffusion region for receiving and storing charge from the photo-conversion device;
a source follower transistor, the source follower transistor being coupled to the floating diffusion region;
a reset transistor, the reset transistor operable to reset the floating diffusion region to a predetermined reset voltage state; and
a row select transistor, the row select transistor acting as a switching device coupled to the source follower transistor,
wherein the digital-to-analog converter is coupled to the pixel.

22. The imaging device of claim 21, wherein an output of the digital-to-analog converter is coupled to the floating diffusion region.

23. The imaging device of claim 21, wherein an output of the digital-to-analog converter is coupled to an output terminal of the photo-conversion device.

24. The imaging device of claim 13, wherein the storage circuit comprises a look-up table.

25. An imaging device comprising:
an optical linear stimulus device for providing a calibration signal;
an analog chain adapted to receive the calibration signal from the linear stimulus device, the analog chain comprising a pixel and associated pixel readout circuitry;
an analog-to-digital converter coupled to the analog chain, the analog-to-digital converter converting a representation of the calibration signal to a digital value;
a linearization circuit adapted to receive an output from the analog-to-digital converter and the calibration signal from the optical linear stimulus device, the linearization circuit further adapted to determine correction values for linearizing the analog-to-digital converter output based on the analog-to-digital converter output and the calibration signal; and
a storage circuit adapted to receive and store the correction values from the linearization circuit.

26. The imaging device of claim 25, wherein the correction values comprise multiplicative factors of the analog-to-digital converter output.

27. The imaging device of claim 25, wherein the correction values comprise substitution values for the analog-to-digital converter output.

28. The imaging device of claim 25, wherein the optical linear stimulus comprises:
a reference detector comprising a light-receiving device having linear output characteristics; and
a light source.

29. The imaging device of claim 25, wherein the storage circuit comprises a look-up table.

30. A camera system comprising:
a light source for providing a linear stimulus; and
an imaging device comprising:
a reference detector for providing a calibration signal;
an analog chain adapted to receive the calibration signal from the reference detector, the analog chain comprising a pixel and associated pixel readout circuitry;
an analog-to-digital converter coupled to the analog chain, the analog-to-digital converter converting a representation of the calibration signal to a digital value;
a linearization circuit adapted to receive an output from the analog-to-digital converter and the calibration signal from the reference detector, the linearization circuit further adapted to determine correction values for linearizing the analog-to-digital converter output based on the analog-to-digital converter output and the calibration signal; and
a storage circuit adapted to receive and store the correction values from the linearization circuit.

31. The camera system of claim 30, wherein the correction values comprise multiplicative factors of the analog-to-digital converter output.

32. The camera system of claim 30, wherein the correction values comprise substitution values for the analog-to-digital converter output.

33. The camera system of claim 30, further comprising a lens assembly for receiving an image.

34. The camera system of claim 30, further comprising a reflective surface for reflecting light from the light source to the reference detector.

35. The camera system of claim 30, wherein the correction values comprise multiplicative factors of the analog-to-digital converter output.

36. The camera system of claim 30, wherein the correction values comprise substitution values for the analog-to-digital converter output.

37. The imaging device of claim 30, wherein the storage circuit comprises a look-up table.

* * * * *